United States Patent [19]

Mikata et al.

[11] Patent Number: 5,181,088
[45] Date of Patent: Jan. 19, 1993

[54] VERTICAL FIELD EFFECT TRANSISTOR WITH AN EXTENDED POLYSILICON CHANNEL REGION

[75] Inventors: Yuuichi Mikata, Kawasaki; Toshiro Usami, Yokohama, both of Japan

[73] Assignee: Kabushiki Kaisha Toshiba, Kawasaki, Japan

[21] Appl. No.: 700,311

[22] Filed: May 8, 1991

Related U.S. Application Data

[63] Continuation of Ser. No. 406,910, Sep. 14, 1989, abandoned.

Foreign Application Priority Data

[30] Sep. 14, 1988 [JP] Japan ................................ 63-231058

[51] Int. Cl.$^5$ ............................................. H01L 29/10
[52] U.S. Cl. .................................... 257/331; 257/332; 257/334
[58] Field of Search ................ 357/23.4, 23.7, 59 E, 357/59 R, 4

[56] References Cited

U.S. PATENT DOCUMENTS

| | | |
|---|---|---|
| 4,470,060 | 9/1984 | Yamazaki . |
| 4,554,570 | 11/1985 | Jastrzebski et al. ................. 357/23.4 |
| 4,554,572 | 11/1985 | Chatterjee ......................... 357/59 E |
| 4,670,768 | 6/1987 | Sunami et al. ..................... 357/23.4 |
| 4,672,410 | 6/1987 | Mikata . |
| 4,920,397 | 4/1990 | Ishijima ............................. 357/23.4 |
| 4,937,641 | 6/1990 | Sunami et al. ..................... 357/23.4 |
| 4,951,102 | 8/1990 | Beitman et al. .................... 357/23.4 |
| 5,001,540 | 3/1991 | Ishihara .............................. 357/23.4 |

FOREIGN PATENT DOCUMENTS

| | | |
|---|---|---|
| 0020929 | 1/1981 | European Pat. Off. . |
| 63-40376 | 2/1988 | Japan .................................. 357/23.4 |
| 1-9662 | 1/1989 | Japan .................................. 357/23.5 |

OTHER PUBLICATIONS

Patent Abstracts of Japan, vol. 7, No. 200 (E-196) [1345], Sep. 3, 1983; Japanese Patent Publication No. 58-97868, dated Jun. 10, 1983, Yoshioka.

Patent Abstracts of Japan, vol. 10, No. 340 (E-455)[2396], Nov. 18, 1986; Japanese Patent Publication No. 61-144875, dated Jul. 2, 1986, Ebihara.

*Primary Examiner*—Andrew J. James
*Assistant Examiner*—Courtney A. Bowers
*Attorney, Agent, or Firm*—Finnegan, Henderson, Farabow, Garrett and Dunner

[57] ABSTRACT

An MOS FET of the semiconductor device includes a semiconductor substrate on which a projection is formed via a given film. The projection is made of a polysilicon having grain boundaries. A pair of gate electrodes are provided so that one of the gate electrodes faces the other thereof via side walls of the projection and gate oxide films. A conductive channel forming area is formed at the side walls of the projection, so that the extending direction of the channel is parallel to the thickness direction of the substrate.

4 Claims, 4 Drawing Sheets

VERTICAL FIELD EFFECT TRANSISTOR WITH AN EXTENDED POLYSILICON CHANNEL REGION

This application is a continuation of application Ser. No. 07/406,910 filed Sep. 14, 1989 abandoned.

BACKGROUND OF THE INVENTION

1. Field of the Invention

The present invention relates to a semiconductor device comprising MOS type field effect transistors (hereinafter referred to as MOS FETs) and, in particular, to a structure and material of the MOS FET.

2. Description of the Related Art

FIG. 8 shows an MOS FET of a background art. As shown in FIG. 8, oxide film 2 is formed on semiconductor substrate 1, and gate electrode 3 is further formed on film 2. At both sides of gate electrode 3, impurities such as boron or arsenic are diffused into substrate 1 so that p-n junctions are formed therebetween. Thereafter, source and drain regions 4 and 5 are formed. Conventionally, a silicon single crystal is used for the substrate of MOS FETs.

FIG. 9 shows another MOS FET of a second background art. As shown in FIG. 9, polysilicon layer 7 is formed on insulating substrate 6, and the MOS FET structure shown in FIG. 8 is further formed on polysilicon layer 7. Such a structure can be adapted to a liquid crystal display device or the like.

In FIG. 9, polysilicon layer 7 is deposited on insulating substrate 6. Gate oxide film 8 and gate electrode 9 are subsequently stacked on polysilicon layer 7. Thereafter, impurities such as boron or arsenic are diffused in both sides of the stacked layer, so that source and drain regions 10 and 11 are formed. Then, an MOS FET structure is obtained wherein a conductive channel forming area is formed by the polysilicon layer which is parallel to the main plane of the substrate.

When the MOS FET of FIG. 9 is used as a circuit element contained in an LSI chip, a problem occurs.

More specifically, when the MOS FET is to be formed, the source and drain regions are obtained by a thermal diffusion of p- or n-type impurities, or by an ion implantation of such impurities. Thereafter, a heat treatment process such as a passivasion film forming process is normally executed to manufacture an LSI chip. Such a heat treatment process, however, invites unintentional diffusion of the impurities at the source and drain regions.

Conventionally, a polysilicon involves grain boundaries at which many dangling bonds and/or many vacancies exist. These dangling bonds and/or vacancies accelerate the speed of a thermal diffusion. (Roughly speaking, a thermal diffusion coefficient of impurities in a polysilicon is several to several tens the number of a thermal diffusion coefficient of impurities in a single crystal silicon.) For this reason, when the distance between the source and the drain becomes small, the source could be short-circuited to the drain by the thermal diffusion in the case of FIG. 9, even if a manufacturing technique ensures no short-circuiting in the case of FIG. 8.

According to a current LSI process, the length of an impurity diffusion in the case of FIG. 8 is an order of about 1000 Å. Consequently, no problem occurs when the distance between the source and the drain is about 1 $\mu$m. However, the length of an impurity diffusion in the case of FIG. 9 is an order of about 1 $\mu$m, thereby causing the problem of said short-circuiting. This problem cannot be avoided even if insulating substrate 6 of FIG. 9 is made of a single crystal silicon.

As mentioned above, it is hard to reduce the length of a conductive channel forming area formed in a polysilicon of an MOS FET, because a thermal diffusion of impurities of the source and drain regions at the conductive channel forming area is so large. In other words, according to a currently available LSI technique, it is very difficult to minimize the size of an MOS FET along its lateral direction.

SUMMARY OF THE INVENTION

It is accordingly an object of the present invention to provide a semiconductor device comprising an MOS FET having a conductive channel forming area formed in a polysilicon, wherein the size of the MOS FET along its lateral direction can be effectively reduced.

To achieve the above object, an MOS FET of the semiconductor device according to the present invention comprises a semiconductor substrate or an insulating substrate on which a projection is formed via a given film. The projection is made of a polysilicon having grain boundaries. A pair of gate electrodes are provided so that one of the gate electrodes faces the other thereof, via side walls of the projection and gate oxide films. A conductive channel forming area is formed at the side walls of the projection, so that the extending direction of the channel is parallel to the thickness direction of the substrate.

The above-mentioned given film located between the projection and the substrate can be made of a semiconductor film or a laminate layer of a semiconductor film and an insulating film when a semiconductor substrate is adapted. When an insulating substrate is adapted, the given film can be made of a semiconductor film.

The above-mentioned polysilicon having grain boundaries may be a conventional polysilicon whose grain size is not limited to a specific value.

According to an MOS FET having the above-mentioned configuration, the conductive channel forming area is provided along a direction of the thickness of the substrate, or along a vertical direction perpendicular to the substrate. Then, the channel length of the MOS FET can be effectively increased while avoiding increase in size along a lateral direction parallel to the main surface of the substrate.

Even if a thermal diffusion of impurities of the source and drain regions at the conductive channel forming area is relatively larger than that in the case of a single crystal silicon, when the vertical length (height) of the projection, i.e., the length of the channel, is preselected to be large, it is possible to avoid occurrence of short-circuiting between the source and drain regions due to a thermal diffusion. Thus, the size of the MOS FET along its lateral direction can be readily reduced.

The MOS FET of the present invention can be provided with a pair of gate electrodes in which the projection is sandwiched.

According to an MOS FET of the present invention, two opposite conductive channel forming areas can be formed within one projection (common base region). At the edges of the projection, source and drain regions are respectively formed so that one or more MOS FETs are constructed. In this case, either the source regions or the drain regions may be constituted as a common region. Or, both the source regions and the drain regions may be separated from one another. According to the above configuration, an effective area for forming active circuit elements on the main plane of the substrate can be materially increased, to thereby obtain a high-integrating dencity semiconductor device.

DESCRIPTION OF THE PREFERRED EMBODIMENTS

Figure 1:
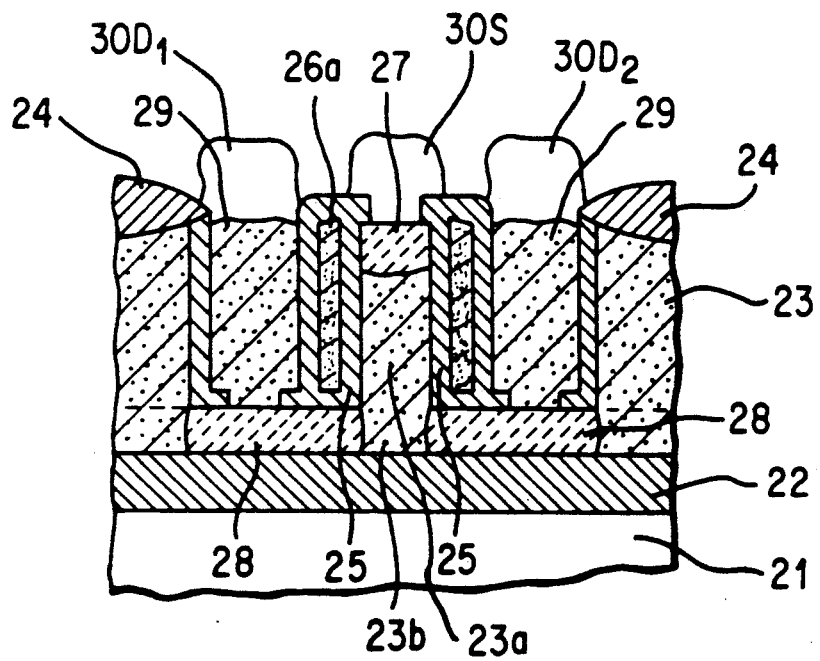
FIG. 1 is a sectional view of an MOS FET according to an embodiment of the present invention.

Preferred embodiments of this invention will be described with reference to the accompanying drawings. In the description the same or functionally equivalent elements are denoted by the same or similar reference numerals, to thereby simplify the description.

Figure 2:
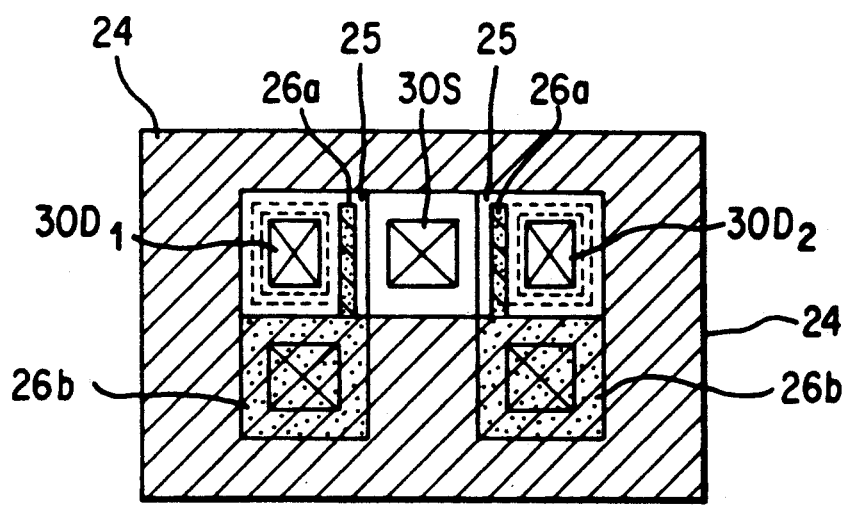
FIG. 2 is a plane view of the MOS FET shown in FIG. 1.

FIG. 1 is a sectional view of an MOS FET according to an embodiment of the present invention. FIG. 2 is a plane view of the MOS FET shown in FIG. 1. FIGS. 3-7 illustrate how the MOS FET of the above embodiment is manufactured.

Figure 3:
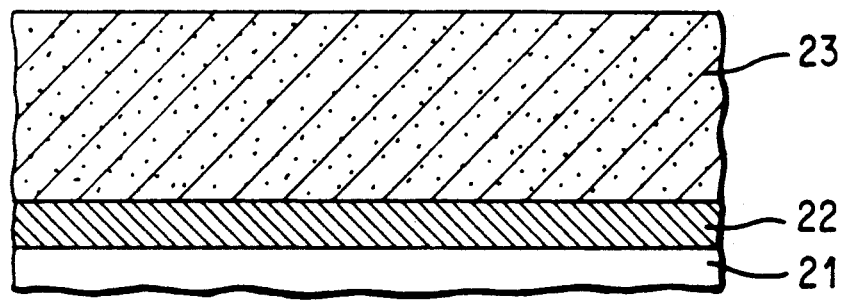
FIGS. 3 to 6 are sectional views illustrating the manufacturing process of the MOS FET shown in FIGS. 1 and 2.

As shown in FIG. 3, single crystal silicon substrate 21 having the Miller indices (0 1 1) and resistivity 10 $\Omega$cm is prepared. On substrate 21, oxide film 22 having a thickness of 0.5 $\mu$m is formed by a thermal oxidation. Polysilicon layer 23 having a thickness of 2 $\mu$m is deposited on film 22 by an LPCVD (low pressure chemical vapor deposition) method at 700 deg. Celsius.

Figure 4:
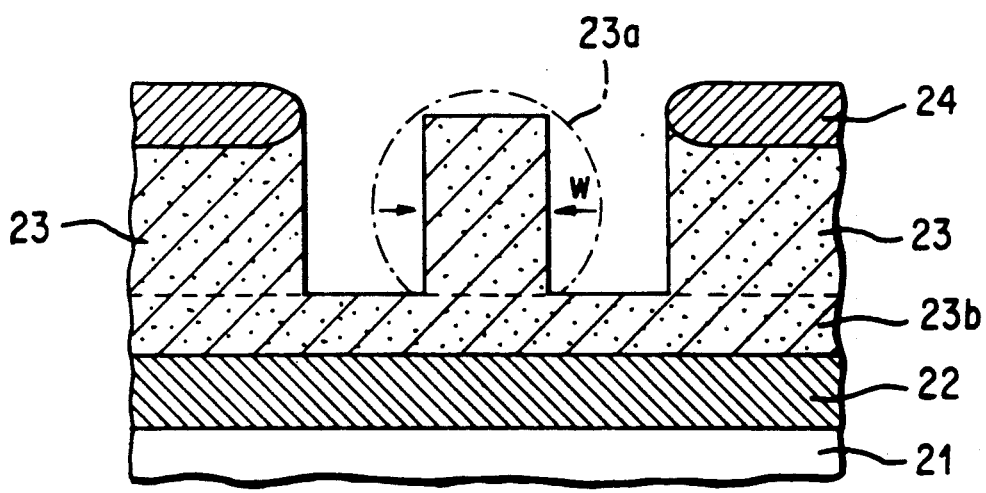

As shown in FIG. 4, boron (B) is ion-implanted to polysilicon layer 23 with a condition of 100 kV and $1 \times 10^{11}$ atoms/cm$^2$. Then, oxide films 24 are selectively formed at element isolation regions. Thereafter, trenches are formed at an element forming area by selective etching, using a reactive ion-etching method, so that a cross-section of the polysilicon layer at the element forming area has a figure as illustrated in FIG. 4.

The center portion of a cross-section of the polysilicon layer constitutes projection 23a (enclosed by the broken line in FIG. 4). The bottom portion of the cross-section constitutes polysilicon film 23b. Projection 23a has a rectangular figure having a width of 1 $\mu$m.

Figure 5:
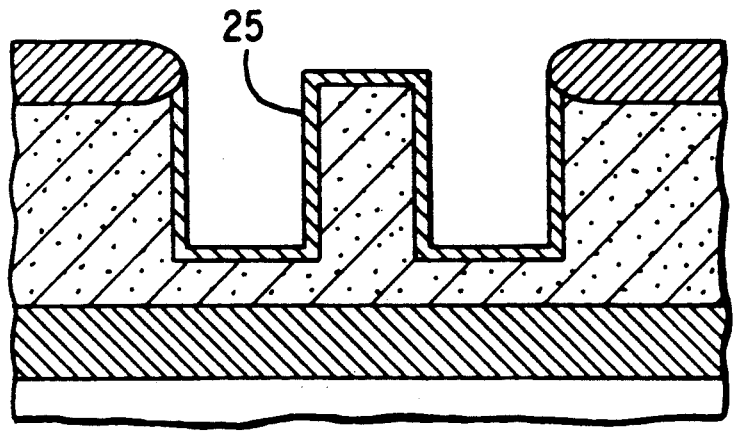

As shown in FIG. 5, gate oxide film 25 having a thickness of 200 Å is formed using a dry oxide gas at 900 deg. Celsius.

Figure 6:
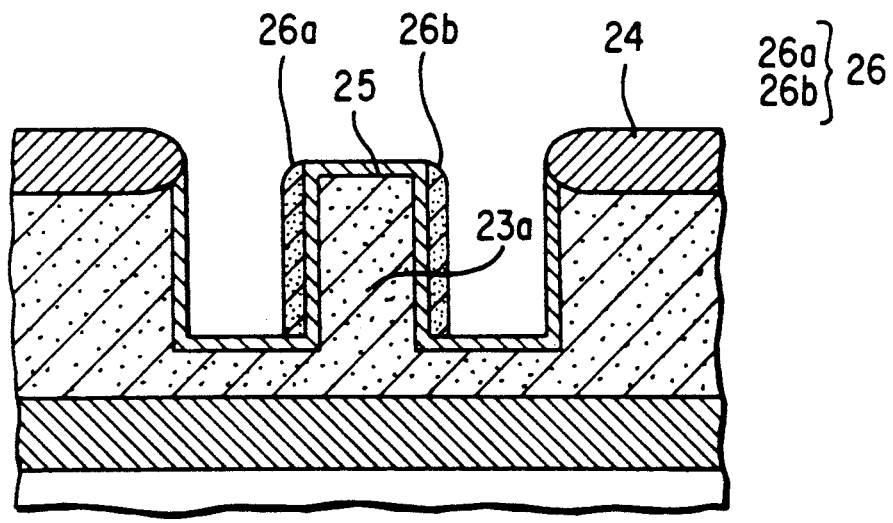
Figure 7:
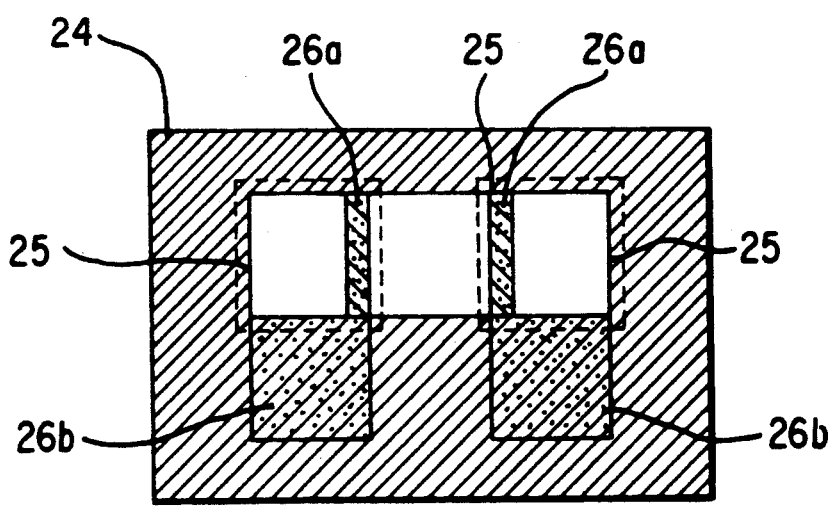
FIG. 7 is a plane view of the MOS FET shown in FIG. 6.
Figure 8:
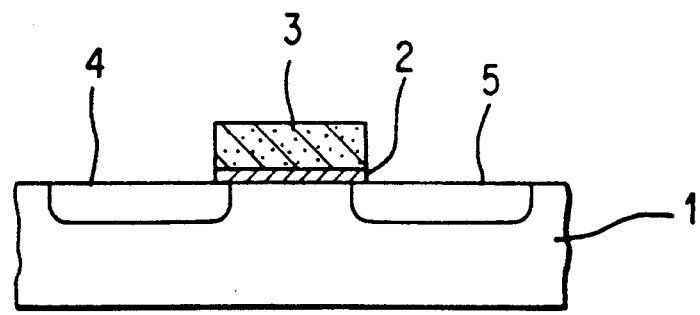
FIG. 8 shows an MOS FET of a background art.

As shown in FIGS. 6 and 7, polysilicon layer 26, to which impurities are doped by an LPCVD method, is deposited on film 25, to thereby form layer 26 with a thickness of 2000 Å. The side wall of projection 23a and a predetermined region at which a gate electrode will be formed are covered with a resist. Then, using a reactive ion-etching method, etching is performed so that polysilicon film 26a for the gate electrode remains at the side of projection 23a and polysilicon film 26b for a gate wiring electrode remains on oxide film 24.

As shown in FIGS. 1 and 2, arsenic (As) for forming source region 27 and drain region 28 is selectively ion-implanted under the condition of 20 kV and $1 \times 10^{15}$ atom/cm$^2$. (Incidentally, regions 27 and 28 may be drain and source, respectively.)

Thereafter, oxidation is performed, and contact holes are opened over the locations of source region 27 and drain region 28. Low resistivity polysilicons 29 obtained by doping impurities are inserted in the trenches using the LPCVD method. The wiring is performed by aluminum (Al) 30, so that source electrode 30S and drain electrodes 30D$_1$ and 30D$_2$ are formed.

The present invention is directed to the structure of the MOS-FET shown in FIG. 1. On the main plane of semiconductor substrate 21, polysilicon projection 23a is formed via oxide film 22 and polysilicon film 23b. A pair of gate electrodes 26a face both sides of the projection 23a via gate oxide films 25. The upper and lower portions of projection 23a are provided with source and drain regions 27 and 28, respectively. Since the side wall of projection 23a is substantially perpendicular to the main plane of the substrate, a conductive channel forming area is formed at the side wall of projection 23a along the direction of the thickness of the substrate. An MOS FET structure having gate electrode 26a, gate oxide film 25, and the projection side wall can thus be formed, by which two vertical MOS FETs having a common source electrode can be obtained.

According to the MOS structure as mentioned above, it is possible to obtain a conductive channel forming area having a desired length, by adjusting the height of the projection, without changing the size in the lateral direction of the element forming area.

Figure 9:
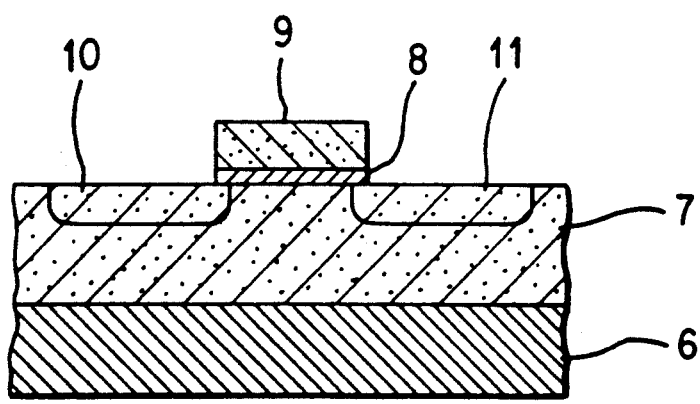
FIG. 9 shows an MOS FET of another background art.

Further, according to the above MOS FET, even if a thermal diffusion of impurities of the source and drain regions occurs during various heat treatments, performed after the formation of the source and drain regions and before the completion of manufacturing the LSI chip, a problem of short-circuiting between the source and drain regions can be avoided, because the distance between the source and drain regions can be made large without lowering the integration density of the LSI. Thus, practical restrictions to the condition of heat treatments can be lowered while achieving the minimization of the device along the lateral direction. (For instance, when the lower limit of the lateral size is 10 $\mu$m in case of FIG. 9, the lower limit of the same can be less than 5 $\mu$m according to the configuration of FIG. 1.)

Incidentally, in the above embodiment, oxide film 22 and polysilicon film 23b are inserted between single crystal silicon substrate 21 and polysilicon projection 23a. The manufacturing method of the embodiment is such that after polysilicon film 23 is deposited, trenches are formed by a reactive ion-etching method, so that projection 23a and polysilicon film 23b are formed simultaneously.

While the invention has been described in connection with what is presently considered to be the most practical and preferred embodiment, it is to be understood that the invention is not limited to the disclosed embodiment but, on the contrary, is intended to cover various modifications and equivalent arrangements included within the scope of the appended claims, which scope is to be accorded the broadest interpretation so as to encompass all such modifications and equivalent arrangements. For instance, if an MOS structure has a polysilicon projection formed over a silicon substrate via a semiconductor film, such an MOS structure would be covered by the present invention. Further, lithography or the like can be applied to embody the present invention.

What is claimed is:

1. A semiconductor device having an MOS transistor structure, comprising:
    a projection formed of polysilicon having grain boundaries, said projection being over a main horizontal plane of a substrate;
    a film interposed between said projection and said substrate, said projection having two vertical side walls and said film having two vertical side walls each in alignment with respective ones of said vertical side walls of said projection to form first and second vertical side walls each comprising one of said vertical side walls of the projection and the aligned vertical side wall of the film;
    a first gate electrode which faces one of the vertical side walls of said projection, so that a conductive channel forming area is formed in said projection;
    a gate insulating film interposed between said first gate and said projection;
    a second gate electrode which faces the other vertical side wall of said projection, so that a conductive channel forming area is formed in said projection;
    a gate insulating film interposed between said second gate and said projection;
    a first region of a first conductivity type having a vertical side wall, said first region being on the main horizontal plane of said substrate with the vertical side wall of the first region coincident with a portion of the first vertical side wall; and
    a second region of the first conductivity type having a vertical side wall, the second region being on the main horizontal plane of said substrate with the vertical side wall of the second region coincident with a portion of the second vertical side wall.

2. A MOS transistor device comprising:
    a semiconductor substrate;
    a region of a first conductivity type over a surface of the substrate, the longitudinal direction of said region arranged substantially parallel to the surface of said substrate;
    a pair of gate electrodes each arranged substantially perpendicular to the surface of said substrate;
    a projection of a second conductivity type over the surface of said substrate, such that said projection is sandwiched by said gate electrodes, said projection having first and second end portions, the first end portion contacting said region along a line substantially perpendicular to the substrate;
    insulating films interposed between said gate electrodes and said projection; and
    another region of the first conductivity type on the second end portion of said projection.

3. A device according to claim 2, wherein said projection includes a polysilicon layer adjacent to one of said gate electrodes in which layer a channel of the MOS transistor is formed.

4. A semiconductor device having an MOS transistor struture, comprising:
    a projection formed of a polysilicon layer having grain boundaries, said projection being over a main horizontal plane of a substrate, and said projection having first and second vertical side walls;
    a first gate electrode which faces one of the first vertical side wall of said projection, so that a conductive channel forming area is formed in said projection;
    a first gate insulating film interposed between said first gate and said projection;
    a second gate electrode which faces the second vertical side wall of said projection, so that a conductive channel forming area is formed in said projection;
    a second gate insulating film interposed between said second gate and said projection;
    a first region of a first conductivity type having a vertical side wall, said first region being on the main horizontal plane of said substrate with the vertical side wall of the first region coincident with a portion of the first vertical side wall of said projection; and
    a second region of the first conductivity type having a vertical side wall, the second region being on the main horizontal plane of said substrate with the vertical side wall of the second region coincident with a portion of the second vertical side wall of said projection.

* * * * *

UNITED STATES PATENT AND TRADEMARK OFFICE
CERTIFICATE OF CORRECTION

PATENT NO. : 5,181,088

DATED : January 19, 1993

INVENTOR(S) : Yuuichi Mikata et al.

It is certified that error appears in the above-identified patent and that said Letters Patent is hereby corrected as shown below:

Title page, item [57], line 6, after "thereof" insert --,--.

Signed and Sealed this

Fourth Day of January, 1994

Attest:

BRUCE LEHMAN

Attesting Officer  Commissioner of Patents and Trademarks